United States Patent
Hiyoshi et al.

(10) Patent No.: US 11,978,683 B2
(45) Date of Patent: May 7, 2024

(54) SEMICONDUCTOR APPARATUS

(71) Applicant: SUMITOMO ELECTRIC INDUSTRIES, LTD., Osaka (JP)

(72) Inventors: Toru Hiyoshi, Osaka (JP); Hirotaka Oomori, Osaka (JP); Ren Kimura, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 531 days.

(21) Appl. No.: 17/282,864

(22) PCT Filed: Oct. 10, 2019

(86) PCT No.: PCT/JP2019/040092
§ 371 (c)(1),
(2) Date: Apr. 5, 2021

(87) PCT Pub. No.: WO2020/090411
PCT Pub. Date: May 7, 2020

(65) Prior Publication Data
US 2021/0351092 A1    Nov. 11, 2021

(30) Foreign Application Priority Data

Oct. 30, 2018   (JP) ................. 2018-203727

(51) Int. Cl.
*H01L 23/053*   (2006.01)
*H01L 23/00*    (2006.01)
(Continued)

(52) U.S. Cl.
CPC .......... *H01L 23/053* (2013.01); *H01L 23/142* (2013.01); *H01L 23/367* (2013.01);
(Continued)

(58) Field of Classification Search
CPC ..... H01L 23/13; H01L 23/3735; H01L 25/07; H01L 25/18; H01L 24/48;
(Continued)

(56) References Cited

U.S. PATENT DOCUMENTS 9,324,684 B2   4/2016  Hino
9,412,679 B1   8/2016  Nakahara et al.
(Continued)

FOREIGN PATENT DOCUMENTS

JP    2007-184525    7/2007
JP    2015-046476    3/2015
(Continued)

*Primary Examiner* — Mouloucoulaye Inoussa
(74) *Attorney, Agent, or Firm* — IPUSA, PLLC

(57) ABSTRACT

A semiconductor apparatus includes a heatsink plate, a substrate disposed on the heatsink plate, a circuit pattern disposed on the substrate, a semiconductor chip disposed on the circuit pattern, a case fixed to the heatsink plate and surrounding an outer perimeter of the substrate, a terminal attached to the case, and a wire configured to electrically connect the terminal to the circuit pattern or to the semiconductor chip. In a plan view as viewed in the thickness direction of the heatsink plate, a portion of the circuit pattern overlaps the terminal.

10 Claims, 5 Drawing Sheets

(51) Int. Cl.
   *H01L 23/14* (2006.01)
   *H01L 23/367* (2006.01)
   *H01L 23/498* (2006.01)

(52) U.S. Cl.
   CPC ........ *H01L 23/49811* (2013.01); *H01L 24/48* (2013.01); *H01L 2224/48157* (2013.01)

(58) Field of Classification Search
   CPC ... H01L 23/49811; H01L 23/36; H01L 23/04; H01L 23/142; H01L 23/053; H01L 23/367; H01L 24/92; H01L 24/45; H01L 24/32; H01L 24/83; H01L 24/29; H01L 24/73; H01L 24/49; H01L 24/85; H01L 23/528; H01L 23/3121; H01L 23/3675; H01L 23/24; H01L 23/5386; H01L 24/41; H01L 23/12; H01L 25/072; H01L 23/562; H01L 23/10; H01L 2224/29101; H01L 2224/32225; H01L 2224/92247; H01L 2224/73265; H01L 2224/48091; H01L 2224/0603; H01L 2224/48157; H01L 2224/48247; H01L 2924/19107; H01L 2224/45014; H01L 2224/48227; H01L 2224/45124; H01L 2924/00014; H01L 2924/13055; H01L 2224/48137; H01L 2224/49175; H01L 2224/83399; H01L 2224/29099; H01L 2224/85399; H01L 2224/48464; H01L 2924/13091; H01L 2224/4118; H01L 2924/10272; H01L 2224/05552; H01L 2224/32227; H01L 2224/4009; H01L 2224/37147; H01L 2224/84801; H01L 2224/04042; H01L 2924/00012
   USPC ....... 257/666, 691, 698, 659, 773, 713, 784, 257/387, 712, 378, E25.016, E25.031; 438/124, 121; 361/715, 796, 622, 790, 361/783
   See application file for complete search history.

(56) References Cited

U.S. PATENT DOCUMENTS

| | | | | |
|---|---|---|---|---|
| 2009/0244868 | A1* | 10/2009 | Morita | H01L 24/84 |
| | | | | 174/257 |
| 2014/0104790 | A1* | 4/2014 | Yoon | H05K 7/209 |
| | | | | 361/715 |
| 2016/0365298 | A1* | 12/2016 | Yamada | H01L 23/3114 |
| 2018/0226324 | A1 | 8/2018 | Kimura et al. | |
| 2021/0082780 | A1* | 3/2021 | Takizawa | H01L 23/5386 |

FOREIGN PATENT DOCUMENTS

| | | |
|---|---|---|
| JP | 2015-095540 | 5/2015 |
| JP | 2016-171269 | 9/2016 |
| JP | 2018-125494 | 8/2018 |

* cited by examiner

SEMICONDUCTOR APPARATUS

TECHNICAL FIELD

The disclosures herein relate to a semiconductor apparatus.

The present application claims priority to Japanese application No. 2018-203727 filed on Oct. 30, 2018, and the entire contents of the Japanese application are hereby incorporated by reference.

BACKGROUND ART

A semiconductor apparatus in which a substrate having an insulating plate, a circuit pattern, and a semiconductor chip are mounted on a heatsink plate is known in the art (see Patent Document 1 and Patent Document 2, for example). A terminal for securing an electrical connection with the outside is connected via a wire to the circuit pattern or the semiconductor chip.

RELATED-ART DOCUMENTS

Patent Document

[Patent Document 1] Japanese Laid-open Patent Publication No. 2015-95540
[Patent Document 2] Japanese Laid-open Patent Publication No. 2016-171269

SUMMARY OF THE INVENTION

A semiconductor apparatus according to an embodiment includes a heatsink plate, a substrate disposed on the heatsink plate, a circuit pattern disposed on the substrate, a semiconductor chip disposed on the circuit pattern, a case fixed to the heatsink plate and surrounding an outer perimeter of the substrate, a terminal attached to the case, and a wire configured to electrically couple the terminal to the circuit pattern or to the semiconductor chip. In a plan view as viewed in the thickness direction of the heatsink plate, a portion of the circuit pattern overlaps the terminal.

MODE FOR CARRYING OUT THE INVENTION

Figure 1:
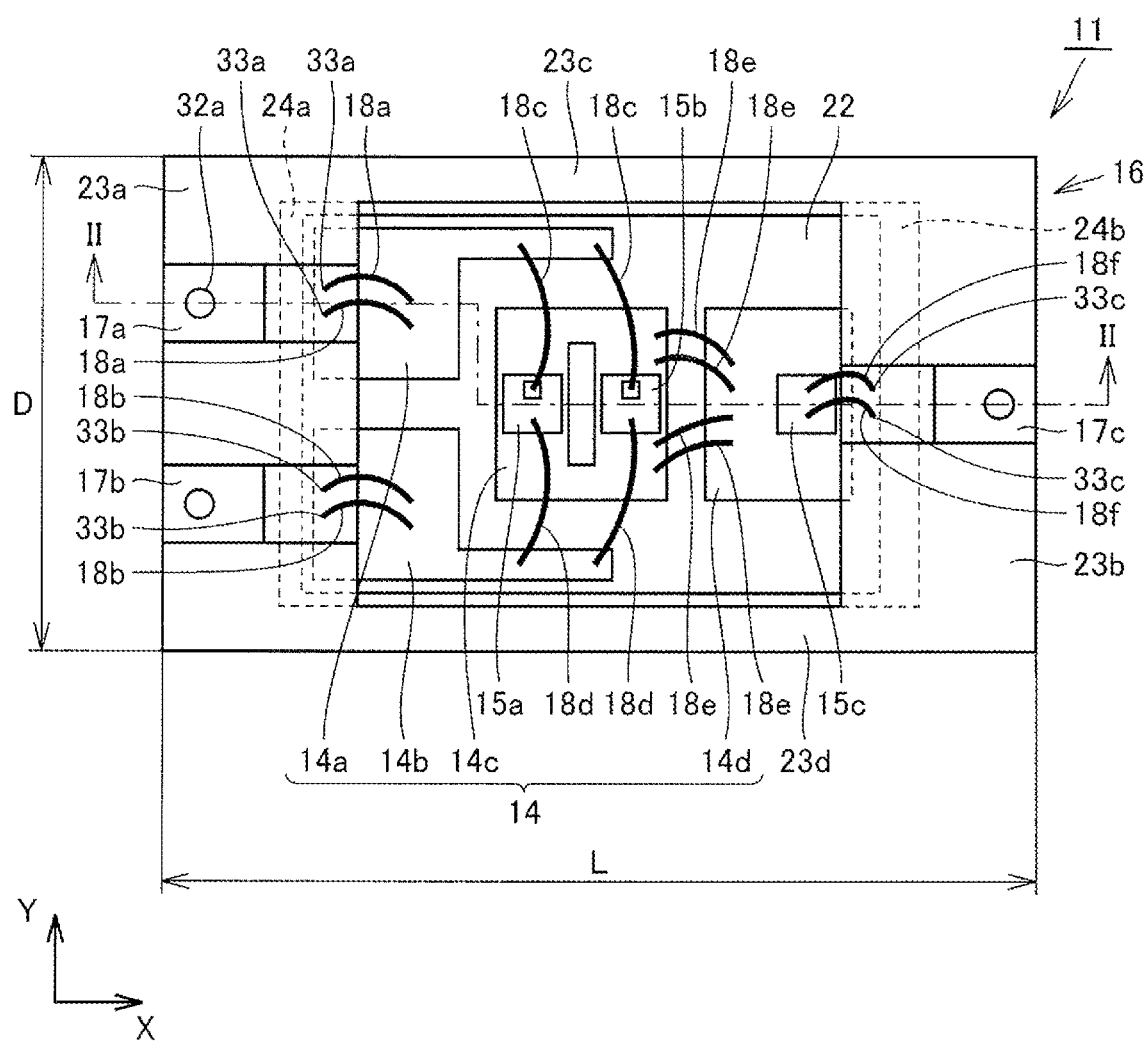
FIG. 1 is a schematic plan view of a semiconductor apparatus of a first embodiment as viewed in the thickness direction of a heatsink plate.

Problem to be Solved by the Present Disclosures

Nowadays, reduction in size of semiconductor apparatus is required in order to meet the demand for in-vehicle applications or the like. Especially, a footprint which is the area the semiconductor apparatus occupies as viewed in the thickness direction of the heatsink plate is required to be reduced.

Accordingly, one of the objects is to provide a semiconductor apparatus that can reduce the footprint.

Advantage of the Present Disclosures

According to the semiconductor apparatus described above, the footprint can be reduced.

Description of Embodiments of the Present Disclosures

Embodiments of the present disclosures will be listed and described first. A semiconductor apparatus according to the present disclosures includes a heatsink plate, a substrate disposed on the heatsink plate, a circuit pattern disposed on the substrate, a semiconductor chip disposed on the circuit pattern, a case fixed to the heatsink plate and surrounding an outer perimeter of the substrate, a terminal attached to the case, and a wire configured to electrically connect the terminal to the circuit pattern or to the semiconductor chip. In a plan view as viewed in the thickness direction of the heatsink plate, a portion of the circuit pattern overlaps the terminal.

The semiconductor apparatus of the present disclosures is such that in a plan view as viewed in the thickness direction of the heatsink plate, a portion of the circuit pattern overlaps the terminal. The size of the heatsink plate can be reduced by as much as the size of the overlapping area between the terminal and the portion of the circuit pattern. According to the semiconductor apparatus of the present disclosures, thus, the footprint can be reduced.

In the semiconductor apparatus described above, the case may be disposed on the heatsink plate. With this arrangement, the footprint can be reduced by as much as the size of the overlapping area between the case and the heatsink plate in the plan view as viewed in the thickness direction of the heatsink plate.

The semiconductor apparatus may be such that in a plan view as viewed in the thickness direction of the heatsink plate, a portion of the case is in contact with the terminal and extends up to a surface point on the terminal which is connected to the wire. With this arrangement, the portion of the case extending up to the wire-connected surface point on the terminal is able to support the terminal. As a result, when the wire and the terminal are connected by use of an ultrasonic tool, for example, pressing the ultrasonic tool to the terminal has a reduced risk of causing the bending of the terminal.

In the semiconductor apparatus noted above, the semiconductor chip may include a wide band-gap semiconductor. A semiconductor apparatus including a wide band-gap semiconductor withstands high voltage, and has low on-resistance, thereby being suited for in-vehicle use. Such a semiconductor chip may be utilized as a semiconductor chip provided in the small-footprint semiconductor apparatus of the present disclosures, thereby providing a semiconductor apparatus suitable for in-vehicle use.

The semiconductor apparatus noted above may include a metal plate disposed on the heatsink plate and having a first principal surface, and an insulating plate disposed in contact with the first principal surface and having a second principal surface facing away from the metal plate, the second principal surface being in contact with the circuit pattern. When being bonded to the heatsink plate, such a substrate allows easy solder-based bonding by utilizing the metal plate.

DETAILS OF EMBODIMENTS OF THE PRESENT DISCLOSURES

In the following, an embodiment of a semiconductor apparatus of the present disclosures will be described with reference to the drawings. In the following drawings, the same or corresponding elements are referred to by the same numerals, and a duplicate description thereof will be omitted.

First Embodiment

Figure 2:
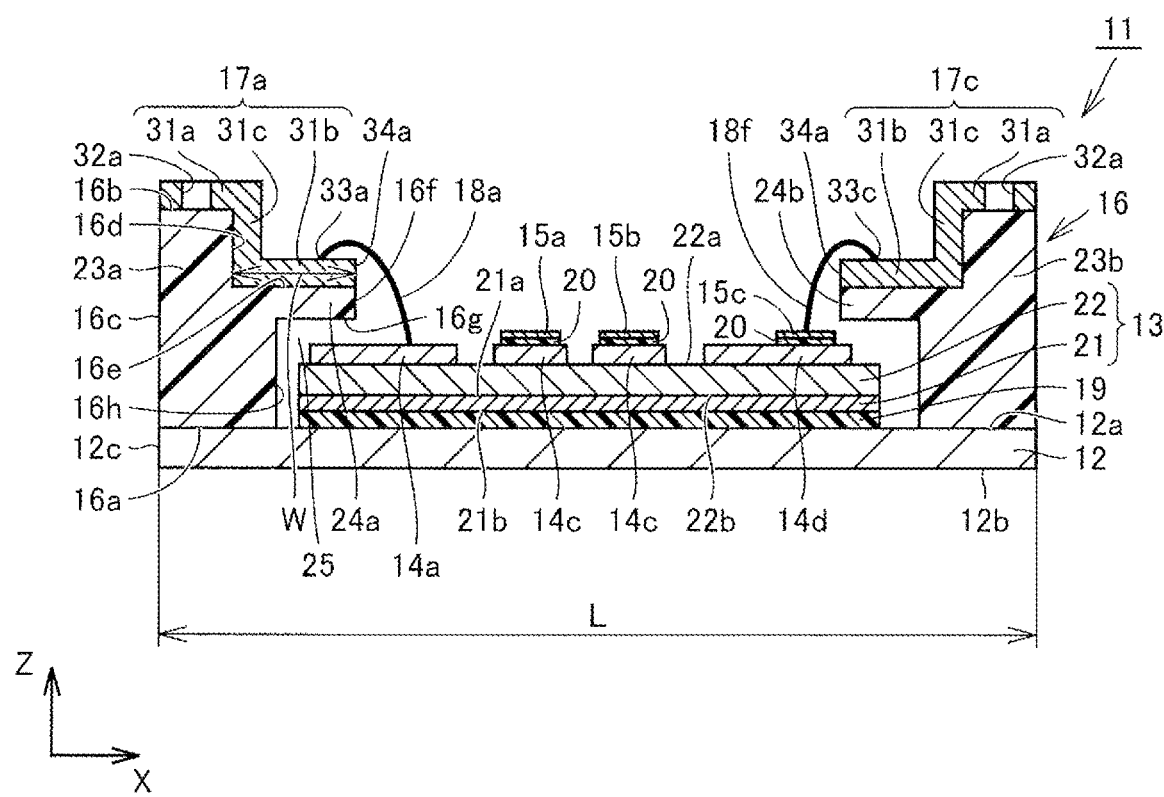
FIG. 2 is a schematic cross-sectional view of the semiconductor apparatus taken along the line II-II in FIG. 1.

In the following, the configuration of a semiconductor apparatus according to a first embodiment of the present disclosures will be described. FIG. 1 is a schematic plan view of a semiconductor apparatus 11 of the first embodiment as viewed in the thickness direction of a heatsink plate. FIG. 1 is a drawing corresponding to a plan view as viewed in the thickness direction of the heatsink plate. FIG. 2 is a schematic cross-sectional view of the semiconductor apparatus 11 taken along the line II-II in FIG. 1. In FIG. 1, portions overlapping terminals or the like are illustrated in dashed lines to facilitate easy understanding.

Referring to FIG. 1 and FIG. 2, the semiconductor apparatus 11 of the first embodiment includes a heatsink plate 12, a substrate 13 disposed on the heatsink plate 12, a circuit pattern 14 disposed on the substrate 13, a plurality of semiconductor chips 15a, 15b, and 15c disposed on the circuit pattern 14, a case 16, a plurality of terminals 17a, 17b, and 17c, and a plurality of wires 18a, 18b, 18c, 18d, 18e, and 18f. In the present embodiment, the semiconductor apparatus 11 includes three semiconductor chips 15a-15c, three terminals 17a-17c, and 14 wires 18a-18f.

The heatsink plate 12 is made of metal. The heatsink plate 12 may be made of copper, for example. The surface of the heatsink plate 12 is treated with nickel plating. The Mane shape of the heatsink plate 12 is an oblong rectangle. In FIG. 1, the length L of the heatsink plate 12 in the X direction is longer than the length D thereof in the Y direction, which is orthogonal to the X direction. The upper principal surface 12a of the heatsink plate 32 has the substrate 13 disposed thereon. The lower principal surface 12b of the heatsink plate 12 may in some cases have heatsink fins (not shown) for efficient heat dissipation, for example. The upper side refers to the positive Z direction, and the lower side refers to the negative Z direction.

The substrate 13 includes a metal plate 21 and an insulating plate 22. The metal plate 21 may be made of copper, for example. The insulating plate 22 may be made of ceramic, for example. Specifically, the insulating plate 22 is made of AlN, SiN, or $Al_2O_3$. The insulating plate 22 may be made of glass.

The substrate 13 has a structure in which the metal plate 21 and the insulating plate 22 are laminated. The metal plate 21 has a first principal surface 21a which is an upper principal surface. The insulating plate 22 has a second principal surface 22a which is an upper principal surface. The insulating plate 22 is disposed on the first principal surface 21a of the metal Plate 21. The substrate 13 is formed such that the first principal surface 21a of the metal plate 21 is in contact with the lower principal surface 22b of the insulating plate 22.

The substrate 13 is disposed on the heatsink plate 12. The substrate 13 is bonded to the heatsink plate 12 by solder 19 disposed between the lower principal surface 21b of the metal plate 21 facing toward the heatsink plate 12 and the upper principal surface 12a of the heatsink plate 12. Namely, the solder 19 is disposed in contact with the upper principal surface 12a of the heatsink plate 12. The solder 19 is disposed in contact with the lower principal surface 21b of the metal plate 21. The substrate 13 is fixed on heatsink plate 12 by the solder 19.

The circuit pattern 14 is disposed on the substrate 13. The circuit pattern 14 is disposed in contact with the second principal surface 22a of the insulating plate 22. The circuit pattern 14 is constituted by a plurality of circuit plates. In the present embodiment, specifically, the circuit pattern includes a first circuit plate 14a, a second circuit plate 14b, a third circuit plate 14c, and a fourth circuit plate 14d. The circuit pattern 14 of the present embodiment may be referred to as copper interconnections.

The semiconductor chips 15a-15c are disposed on the circuit pattern 14. The semiconductor chips 15a-15c are bonded to the circuit pattern 14 by solder 20. Specifically, the semiconductor chips 15a and 15b are bonded to the third circuit plate 14c. The semiconductor chip 13c is bonded to the fourth circuit plate 14d. The semiconductor chips 15a and 15b include a wide band-gap semiconductor. Examples of wide band-gap semiconductors include compound semiconductors such as SIC, GaN, and the like.

The case 16 is made of a resin having an insulating property, for example. In the present embodiment, the case 16 has a rectangular tube shape. The case 16 includes a first wall 23a, a second wall 23b, a third wall 23c, and a fourth wall 23d. The first wall 23a and the second wall 23b are disposed opposite to each other in the X direction. The third wall 23c and the fourth wall 23d are disposed opposite to each other in the Y direction.

The case 16 is disposed on the heatsink plate 12. The case 16 is fixed to the heatsink plate 12. Specifically, the first surface 16a of the case 16 facing toward the heatsink plate 12 and the upper principal surface 12a of the heatsink plate 12 are placed in contact with each other. The surface 16a is a flat surface. The outer perimeter surface 16c of the case 16 and the outer perimeter surface 12c of the heatsink plate 12 are arranged to be flush with each other.

The case 16 has a surface 16b that is connected to the outer perimeter surface 16c and that is spaced apart from the surface 16a in the thickness direction of the heatsink plate 12. The surface 16b is a flat surface. The surface 16a and the surface 16b are parallel. The case 16 has a first inner perimeter surface 16d that is connected to the surface 16b and that is spaced apart from, and in parallel to, the outer perimeter surface 16c. The case 16 has a surface 16e that is connected to the first inner perimeter surface 16d and that is formed in parallel to the surfaces 16a and 16b. The case 16 has a second inner perimeter surface 16f that is connected to the surface 16e and that is formed in parallel to the outer perimeter surface 16c and the inner perimeter surface 16d. The case 16 has a surface 16g that is connected to the second inner perimeter surface 16f and that is formed in parallel to the surfaces 16a, 16b, and 16e. The case 16 has a third inner perimeter surface 16h that is connected to the surface 16g and that is formed in parallel to the outer perimeter surface 16c, the first inner perimeter surface 16d, and the second inner perimeter surface 16f.

The case 16 has a first extension 24a and a second extension 24b. Each of the first extension 24a and the second extension 24b is part of the case 16. The first extension 24a is formed on the first wall 23a. The first extension 24a is formed such as to extend toward the second wall 23b. The first extension 24a is arranged such as to extend from the portion of the first wall 23a connected to the third wall 23c to the portion thereof connected to the fourth wall 23d. The first extension 24a includes a portion of the surface 16e, the inner perimeter surface 16f, and the surface 16g. The first extension 24a is formed at the position that does not interfere with any of the substrate 13, the circuit pattern 14, and the semiconductor chips 15a-15c disposed on the heatsink plate 12. Namely, the length of the inner perimeter surface 16h in the Z direction is longer than the total length, in the Z direction, of the stacked structure obtained when the solder 19, the substrate 13, the circuit pattern 14, the solder 20, and the semiconductor chips 15a-15c are stacked as shown in FIG. 2 and the like.

The second extension 24b is formed on the second wall 23b. The second extension 24b is formed such as to extend toward the first wall 23a. Similarly to the first extension 24a, the second extension 24b is arranged such as to extend from the portion of the second wall 23b connected to the third wall 23c to the portion thereof connected to the fourth wall 23d. Similarly to the first extension 24a, the second extension 24b also includes a portion of the surface 16e, the inner perimeter surface 16f, and the surface 16g. Similarly to the first extension 24a, the second extension 24b is formed at the position that does not interfere with any of the substrate 13, the circuit pattern 14, and the semiconductor chips 15a-15c disposed on the heatsink plate 12.

The terminals 17a-17c are made of metal. In the present embodiment, each of the terminals 17a-17c is formed by bending a flat metal member, for example. The semiconductor apparatus 11 is such that the terminals 17a-17c are utilized to ensure an electrical connection with the outside. The three terminals 17a-17c are each attached to the case 16. Specifically, the terminals 17a and 17b are mounted to the first wall 23a of the case 16 and spaced apart in the Y direction. The terminal 17c is mounted to the second wall 23b. Each of the terminals 17a-17c is mounted at a different position in the Y direction.

In the cross-sectional view illustrated in FIG. 2 (i.e., in the XZ plane), the terminal 17a includes a first portion 31a and a second portion 31b both extending in the X direction and a third portion 31c extending in the Z direction. The first portion 31a and the second portion 31b are connected to each other through the third portion 31c. The first portion 31a has a round penetrating hole 32a that penetrates the entire thickness thereof. The first portion 31a is disposed in contact with the surface 16b. The third portion 31c is disposed in contact with the inner perimeter surface 16d. The second portion 31b is disposed in contact with the surface 16e. In other words, the inner perimeter wall of the case 16 enclosing the outer perimeter of the substrate 13 has an upward facing step face 16e that is situated below the top surface 16b of the case 16 and that is parallel to the principal surface of the heatsink plate 12, with the terminal 17a being (partially) supported by the step face 16e. The end face 34a of the second portion 31b on the side where the third portion 31c is not connected is flush with the inner perimeter surface 16f. The configuration of the terminal 17b and the terminal 17c is substantially the same as the terminal 17a, and a description thereof will be omitted. The distance in the X direction between the end face 34a and the inner perimeter surface 16d is represented by a width W.

The terminal 17a and the first circuit plate 14a of the circuit pattern 14 are electrically connected via the wires 18a. The wires 18a are connected to the terminal 17a at surface points 33a on the terminal 17a. The terminal 17b and the second circuit plate 14b of the circuit pattern 14 are electrically connected via the wires 18b. The wires 18b are connected to the terminal 17b at surface points 33b on the terminal 17b. The semiconductor chips 15a and 15b are field effect transistors, for example. The gate electrodes of the semiconductor chips 15a and 15b and the first circuit plate 14a of the circuit pattern 14 are electrically connected via the respective wires 18c. The source electrodes of the semiconductor chips 15a and 15b and the second circuit plate 14b of the circuit pattern 14 are electrically connected via the respective wires 18d. The drain electrodes situated on the surface of the semiconductor chips 15a and 15b opposite from the surface on which the gate electrodes and the source electrodes are situated are electrically connected to the third circuit plate 14c of the circuit pattern 14. The third circuit plate 14c of the circuit pattern and the fourth circuit plate 14d of the circuit pattern 14 are connected via the wires 18e. The semiconductor chip 15c bonded to the fourth circuit plate 14d is a diode for conducting current in one direction, for example. The cathode electrode of the semiconductor chip 15c and the fourth circuit plate 14d of the circuit pattern 14 are electrically connected. The anode electrode of the semiconductor chip 15c and the terminal 17c are electrically connected via the wires 18f. The wires 18f are connected to the terminal 17c at surface points 33c on the terminal 17c. The wires 18a-18f may be implemented as thick aluminum wires or ribbon wires.

In a plan view as viewed in the thickness direction of the heatsink plate 12, the first extension 24a, which is a portion of the case 16, is in contact with the terminal 17a and extends along under the surface points 33a on the terminal 17a which are connected to the wires 18. Further, the first extension 24a is in contact with the terminal 17b and extends along under the surface points 33b on the terminal 17b which are connected to the wires 18. In the present embodiment, the first extension 24a extends in the X direction up to the end face 34a.

In a plan view as viewed in the thickness direction of the heatsink plate 12, the second extension 24b, which is a portion of the case 16, is in contact with the terminal 17c and extends along under the surface points 33c on the terminal 17c which are connected to the wires 18. In the present embodiment, the second extension 24b extends in the X direction up to the end face 34a.

In the following, a method of making the semiconductor apparatus 11 noted above will be briefly described. First, the substrate 13 having the insulating plate 22 on which the circuit pattern 14 is disposed in a contacting manner is prepared. The solder 20 in film form is then placed at predetermined locations on the circuit pattern 14, and the semiconductor chips 15a, 15b, and 15c are placed thereon. Next, the solder 19 in film form is placed at a predetermined location on the heatsink plate 12, i.e., at the location on which the substrate 13 is to be mounted, followed by mounting the substrate 13 having the solder 20 and the semiconductor chips 15a-15c placed thereon. In so doing, mounting is performed such that the metal plate 21 comes in contact with the solder 19. Subsequently, the solders 19 and 20 are melted by reflow to bond the heatsink plate 12 and the substrate 13 together, and also to bond the circuit pattern 14 and the semiconductor chips 15a-15c together. The case 16 to which the terminals 17a-17c are attached is then secured on the heatsink plate 12. Thereafter, ultrasonic bonding is performed by using an ultrasonic tool, for example, to connect the terminals 17a-17c, the circuit pattern 14, and the semiconductor chips 15a-15c via the wires 18, as illustrated in FIG. 1. The space enclosed by the case is then filled with a resin. With this, the manufacturing of the semiconductor apparatus 11 is completed.

In the semiconductor apparatus 11 as described above, portions of the circuit pattern 14 overlap the terminals 17a-17c in a plan view as viewed in the thickness direction of the heatsink plate 12. The size of the heatsink plate 12 can be reduced by as much as the size of the overlapping areas between the terminals 17a-17c and the portions of the circuit pattern 14. According to the semiconductor apparatus 11, thus, the footprint can be reduced. Specifically, the length L of the heatsink plate 12 in the X direction can be shortened in the semiconductor apparatus 11.

In the present embodiment, the substrate 13 is placed in such a state as if it has burrowed into a space 25. In other, more specific words, the inner perimeter wall of the case 16 enclosing the outer perimeter of the substrate 13 has the downward facing step face 16g which is situated under and parallel to the step face 16e, thereby creating the space 25. The substrate 13 burrows into this space 25, so that a portion of the circuit pattern 14 and a portion of the downward facing step face 16g oppose each other in the thickness direction of the heatsink plate 12. Further, the terminals 17a-17c are brought closer in the X direction to the area where the circuit pattern 14 is formed. This allows the length of the wires 18 to be shortened to reduce the inductance of the wires 18. As illustrated in FIG. 2, the side surface 16h of the inner perimeter wall situated below the downward facing step face 16g is positioned closer to the center of the heatsink plate 12 than the side surface 16d of the inner perimeter wall situated above the upward facing step face 16e in a plan view as viewed in the thickness direction of the heatsink plate 12.

Further, it is possible to increase the distance in the X direction between the third portion 31c and the surface point 33a on the terminal 17a at which the wire 18 and the terminal 17a are connected. Namely, the width N illustrated in FIG. 2 can be increased. This arrangement can reduce the risk that an ultrasonic tool interferes with the third portion 31c when ultrasonic bonding is used to bond the wires 18 to the terminals 17a-17c. As a result, the likelihood of defective bonding between the wires 18 and the terminals 17a-17c is reduced, and the manipulability of the semiconductor apparatus 11 is improved during the manufacturing process.

The present embodiment is such that, in a plan view as viewed in the thickness direction of the heatsink plate 12, the first extension 24a and the second extension 24b, which are a portion of the case 16, are in contact with the terminals 17a-17c and extend along under the surface points 33a-33c on the terminals 17a-17c which are connected to the wires 18. The first extension 24a and the second extension 24b extending along under the surface points 33a-33c on the terminals 17a-17c connected to the wires 18 can support the terminals 17a-17c. Accordingly, when the wires 18 and the terminals 17a-17c are connected by use of an ultrasonic tool, for example, pressing the ultrasonic tool to the terminals 17a-17c has a reduced risk of causing the bending of the terminals 17a-17c. In the present embodiment, the first extension 24a and the second extension 24b extend in the X direction up to the end face 34a. Selecting the location of the surface points 33a-33c on the terminals 17a-17c connected to the wires 18 to be within the range in the X direction up to the end face 34a allows the terminals 17a-17c and the wires 18 to be connected to each other while the terminals 17a-17c are supported by the first extension 24a and the second extension 24b.

In the present embodiment, the case 16 is disposed on the heatsink plate 12. With this arrangement, the footprint can be reduced by as much as the size of the area at which the case 16 and the heatsink plate 12 are in opposing contact with each other in the thickness direction of the heatsink plate 12, as opposed to the case in which the case 16 is disposed to surround the outer perimeter surface 12c of the heatsink plate 12. In the present embodiment, the outer perimeter surface 16c of the case 16 and the outer perimeter surface 12c of the heatsink plate 12 are arranged to be flush with each other. The footprint of the semiconductor apparatus 11 consequently becomes the footprint of the heatsink plate 12.

In the present embodiment, the semiconductor chips 15a and 15b include a wide band-gap semiconductor. The semiconductor apparatus 11 including a wide band-gap semiconductor withstands high voltage, and has low on-resistance, thereby being suited for in-vehicle use. Such semiconductor chips 15a and 15b may be utilized as the semiconductor chips 15a and 15b provided in the small-footprint semiconductor apparatus 11 of the present disclosures, thereby providing the semiconductor apparatus 11 suitable for in-vehicle use.

The present embodiment described above is directed to the configuration in which the first extension 24a and the second extension 24b, which are a portion of the case 16, are in contact with the terminals 17a-17c and extend in the X direction up to the end face 34a. This is not a limiting example. The first extension 24a and the second extension 24b may not extend in the X direction up to the end face 34a, but rather extend up to the surface points 33a-33c on the terminals 17a-17c connected to the wires 18. Further, it suffices for the first extension 24a and the second extension 24b to project from the third inner perimeter surface 16h in the X direction even if not reaching the surface points 33a-33c on the terminals 17a-17c connected to the wires 18. With this arrangement, the portion projecting in the X direction from the third inner perimeter surface 16h can support the terminals 17a-17c when the wires 18 are bonded to the terminals 17a-17c, thereby reducing the bending of the terminals 17a-17c.

Second Embodiment

Figure 3:
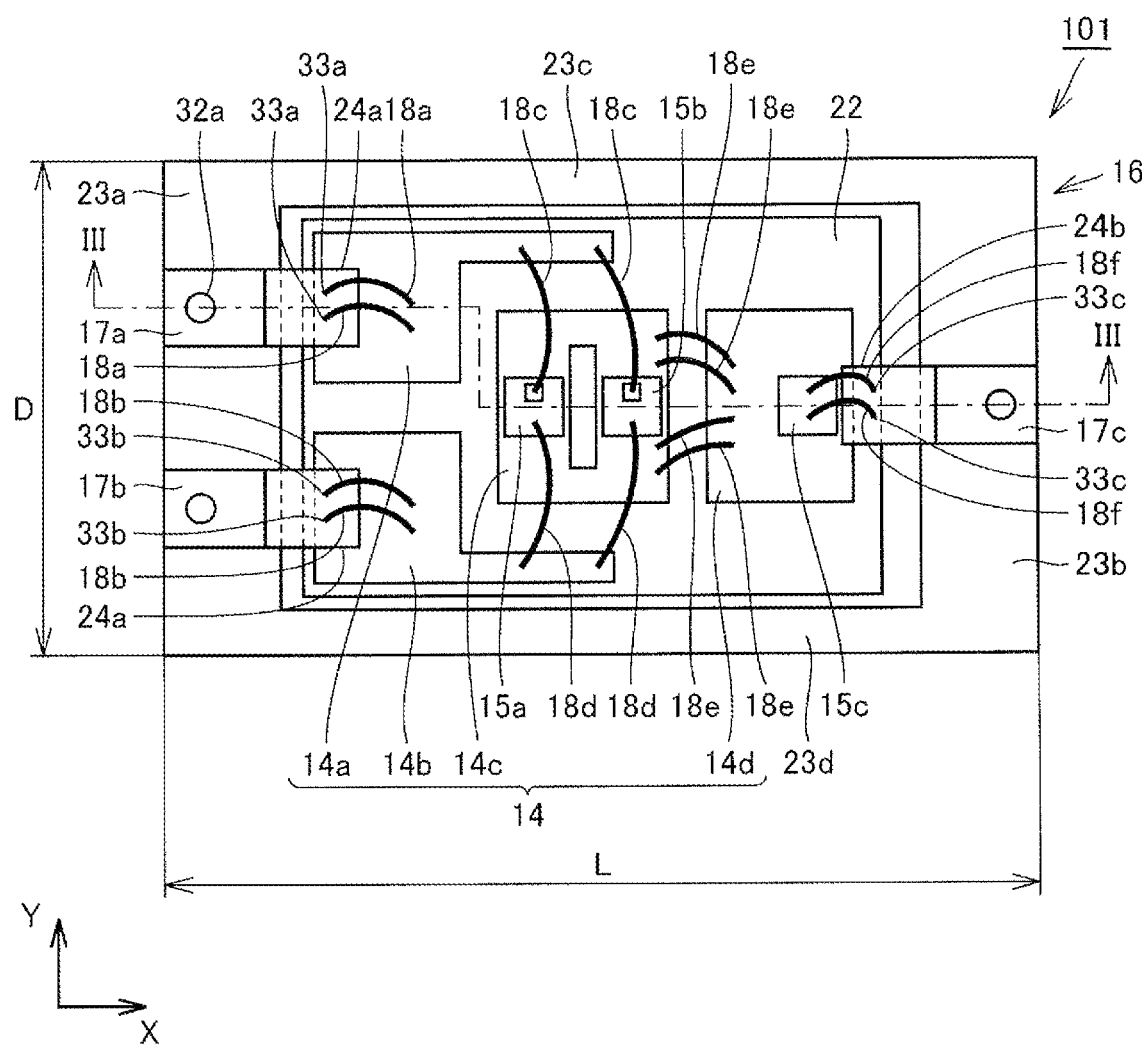
FIG. 3 is a schematic plan view of a semiconductor apparatus of a second embodiment as viewed in the thickness direction of a heatsink plate.

In the following, a second embodiment, which is another embodiment, will be described. FIG. 3 is a schematic plan view of a semiconductor apparatus of the second embodiment as viewed in the thickness direction of a heatsink plate. FIG. 3 is a drawing corresponding to a plan view as viewed in the thickness direction of the heatsink plate. Referring to FIG. 3, a semiconductor apparatus 101 of the second embodiment differs from the semiconductor apparatus of the first embodiment in the structure of the case 16.

Referring to FIG. 3, the case 16 provided in the semiconductor apparatus 101 of the second embodiment has first extensions 24a formed in areas corresponding to the positions at which the terminals 17a and 17b are formed. Further, a second extension 24b is formed in an area corresponding to the position at which the terminal 17c is formed. In the present embodiment, two first extensions 24a are formed and spaced apart in the Y direction. The length, in the Y direction, of the first extension 24a disposed at the area corresponding to the position at which the terminal 17a is formed is the same as the length, in the Y direction, of the terminal 17a. The length, in the Y direction, of the first extension 24a disposed at the area corresponding to the position at which the terminal 17b is formed is the same as the length, the Y direction, of the terminal 17b. The length, in the Y direction, of the second extension 24b disposed at the area corresponding to the position at which the terminal 17c is formed is the same as the length, in the Y direction, of the terminal 17c. A schematic cross-sectional view as taken along the line in FIG. 3 corresponds to FIG. 2. With this arrangement also, the footprint of the semiconductor apparatus 101 can be reduced.

Third Embodiment

Figure 4:
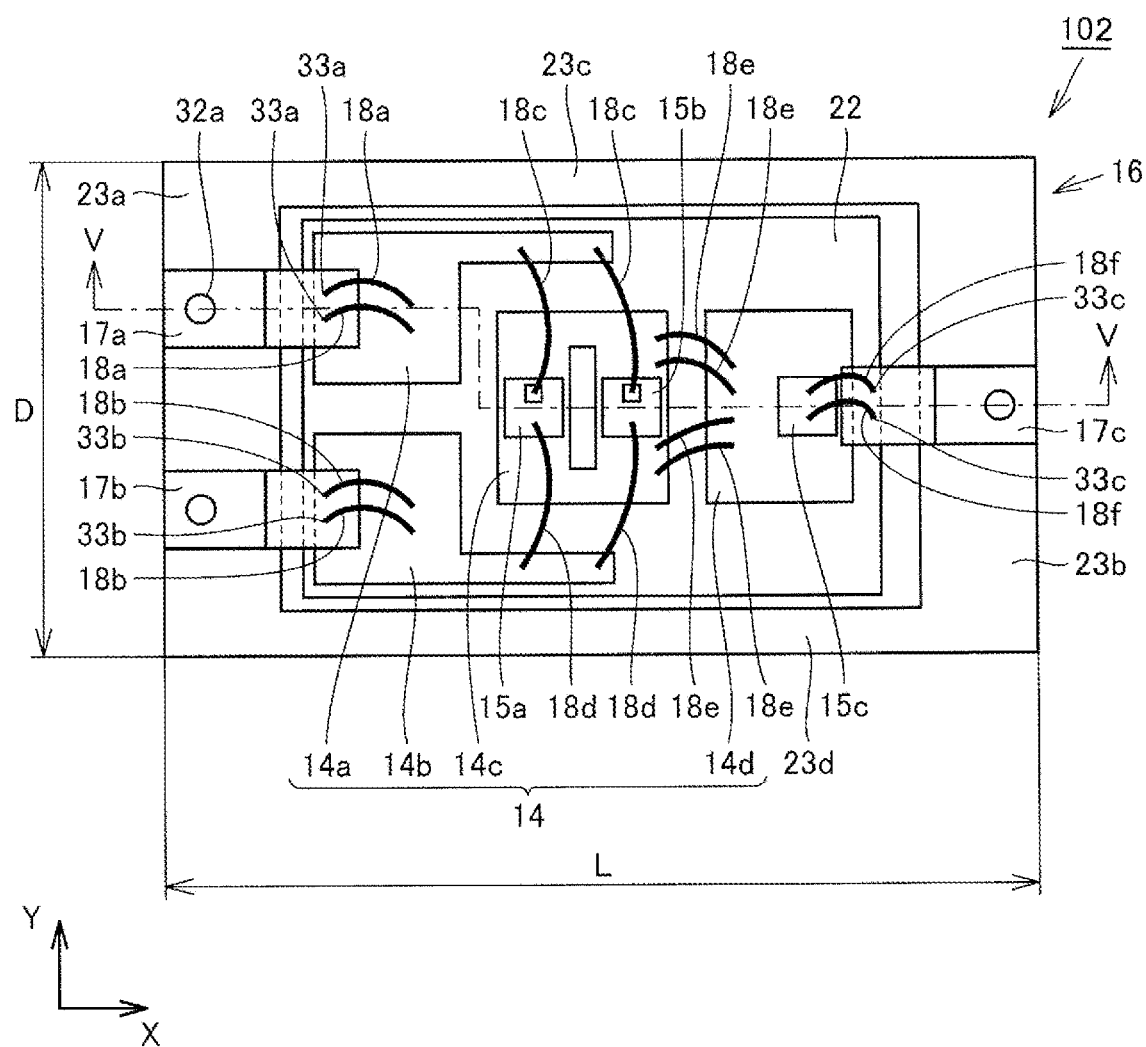
FIG. 4 is a schematic plan view of a semiconductor apparatus of a third embodiment as viewed in the thickness direction of a heatsink plate.
Figure 5:
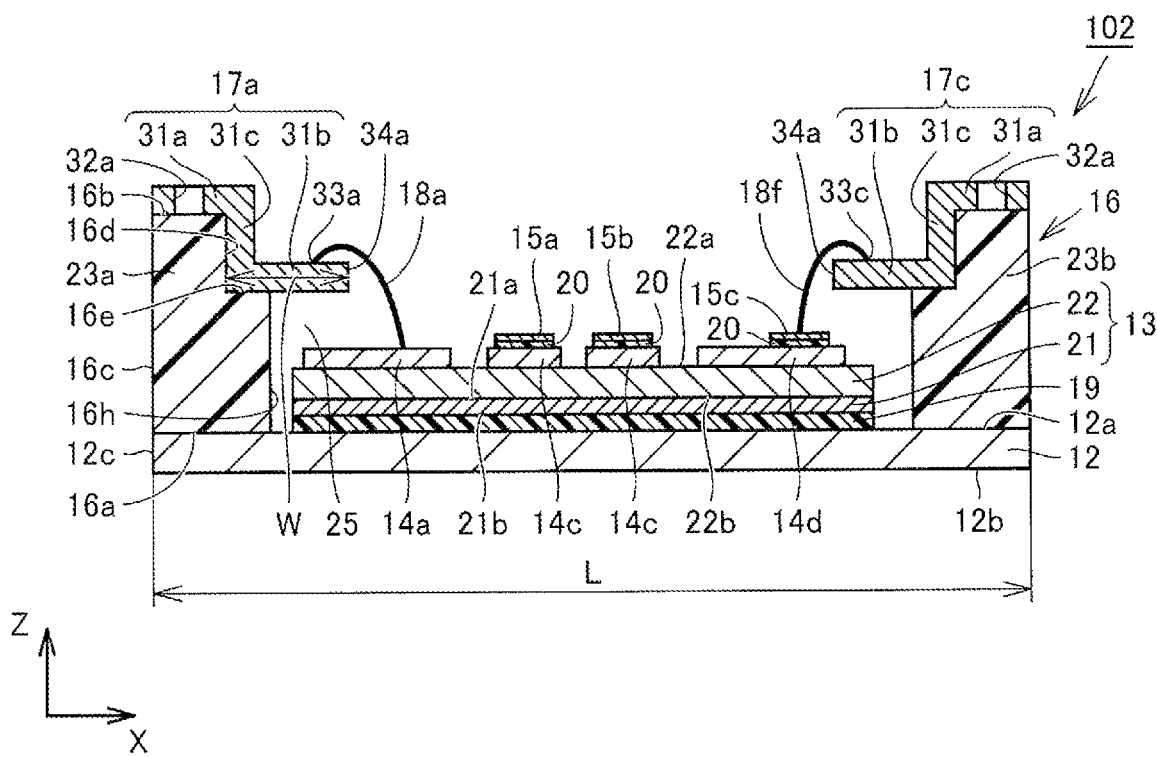
FIG. 5 is a schematic cross-sectional view of the semiconductor apparatus taken along the line V-V in FIG. 4.

In the following, a third embodiment, which is yet another embodiment, will be described. FIG. 4 is a schematic plan view of a semiconductor apparatus of the third embodiment as viewed in the thickness direction of a heatsink plate. FIG. 4 is a drawing corresponding to a plan view as viewed in the thickness direction of the heatsink plate. FIG. 5 is a schematic cross-sectional view of the semiconductor apparatus taken along the line V-V in FIG. 4. Referring to FIG. 4 and FIG. 5, a semiconductor apparatus 11 of the third embodiment differs from the semiconductor apparatus of the first embodiment in the structure of the case 16.

Referring to FIG. 4 and FIG. 5, the case 16 provided in the semiconductor apparatus 102 of the third embodiment does not have either a first extension 24a or a second extension 24b described in the first embodiment previously described. Namely, the present embodiment is configured such that the inner perimeter surface 16h of the case 16 extends straight along the Z direction, and are connected to the surfaces 16a and 16e. The shape of the terminals 17a-17c is the same as that shown in the first embodiment. The second portion 31b of the terminals 17a-17c extends from the inner perimeter surface 16d of the case 16 toward the substrate 13.

With this arrangement also, the footprint of the semiconductor apparatus 102 can be reduced. The semiconductor apparatus 102 according to the third embodiment is easier to assemble than the semiconductor apparatus 11 of the first embodiment because the extensions provided in the semiconductor apparatus 11 of the first embodiment are nonexistent. The semiconductor apparatus 102 having such a configuration is suitably used when the diameter of the wires 18 is small or when a relatively weak force suffices to bond the wires 18 through ultrasonic bonding.

Other Embodiments

In the embodiments described heretofore, the case 16 is disposed on the heatsink plate 12, and the entirety of the surface 16a is situated on the principal surface 12a. This is not a limiting example. Only a part of the surface 16a may be situated on the principal surface 12a in the configuration in which the case 16 is disposed on the heatsink plate 12. With this arrangement, the footprint can be reduced by as much as the size of the area at which the case 16 and the heatsink plate 12 are in opposing contact with each other in the thickness direction of the heatsink plate 12. Alternatively, the case 16 may be disposed such that the outer perimeter surface 12c of the heatsink plate 12 is in contact with the inner perimeter surface 16h of the case 16.

The embodiments described heretofore are such that the semiconductor chips 15a and 15b include a wide band-gap semiconductor. This is not a limiting example, and a semiconductor chip including no wide band-gap semiconductor may be used. Plural semiconductor chips 15a-15c may not be provided, and only one chip may be provided.

Further, the embodiments described heretofore are directed to the configuration in which the substrate 13 includes the metal plate 21 and the insulating plate 22. This is not a limiting example, and the substrate 13 may include an additional plate-like member. In the semiconductor apparatus 11, a plurality of substrates 13, e.g., two, may be provided.

All the embodiments disclosed herein are examples only, and should be interpreted as non-limiting in any aspects. The scope of the present invention is not defined by the descriptions provided heretofore, but is defined by the claims. Any modifications representing and within the equivalent scope of the claims are intended to be within the scope of the present invention.

DESCRIPTION OF REFERENCE SYMBOLS 11, 101, 102 semiconductor apparatus
12 heatsink plate
12a, 12b, 21a, 21b, 22a, 22b principal surface
12c, 16c outer perimeter surface
13 substrate
14 circuit pattern
14a, 14b, 14c, 14d circuit plate
15a, 15b, 15c semiconductor chip
16 case
16a, 16b, 16e, 16g surface
16d, 16f, 16h inner perimeter surface
17a, 17b, 17c terminal
18a, 18b, 18c, 18d, 18e, 18f wire
19, 20 solder
21 metal plate
22 insulating plate
23a, 23b, 23c, 23d wall
24a, 24b extension
25 space
31a, 31b, 31c portion
32a penetrating hole
33a, 33b, 33c surface point
34a end face

The invention claimed is:

1. A semiconductor apparatus, comprising:
a heatsink plate;
a substrate disposed on the heatsink plate;
a circuit pattern disposed on the substrate;
a semiconductor chip disposed on the circuit pattern;
a case fixed to the heatsink plate and surrounding an outer perimeter of the substrate;
a terminal attached to the case; and
a wire configured to electrically connect the terminal to the circuit pattern or to the semiconductor chip,
wherein the case includes a first extension that supports the terminal and, when viewed in a plan view in a thickness direction of the heatsink plate, the first extension extends above and at least partially overlaps the circuit pattern,
wherein the terminal includes a portion that is supported at least partially on the first extension of the case such that, when viewed in a plan view in a thickness direction of the heatsink plate, the portion of the terminal supported at least partially on the first extension of the case extends above and at least partially overlaps the circuit pattern,
wherein the wire comprises:
a first end connected to a surface point of the portion of the terminal supported at least partially on the first extension of the case, and
an opposite end connected to the circuit pattern or the semiconductor chip, wherein the first extension of the case that supports the terminal does not contact the circuit pattern or the semiconductor chip.

2. The semiconductor apparatus as claimed in claim 1, wherein the case is disposed on the heatsink plate.

3. The semiconductor apparatus as claimed in claim 1, wherein in a plan view as viewed in the thickness direction of the heatsink plate, a portion of the case is in contact with the terminal and extends up to a surface point on the terminal, the surface point being connected to the wire.

4. The semiconductor apparatus as claimed in claim 1, wherein the semiconductor chip includes a wide band-gap semiconductor.

5. The semiconductor apparatus as claimed in claim 1, wherein the substrate includes:
   a metal plate disposed on the heatsink plate and having a first principal surface; and
   an insulating plate disposed in contact with the first principal surface and having a second principal surface facing away from the metal plate, the second principal surface being in contact with the circuit pattern.

6. The semiconductor apparatus as claimed in claim 1, wherein an inner perimeter wall of the case surrounding the outer perimeter of the substrate has an upward facing step face that is situated below a topmost surface of the case and that is parallel to a principal surface of the heatsink plate, with the terminal being supported on the step face.

7. The semiconductor apparatus as claimed in claim 6, wherein the inner perimeter wall of the case surrounding the outer perimeter of the substrate has, below the step face and in parallel to the step face, a downward facing step face, and wherein a portion of the circuit pattern and a portion of the downward facing step face oppose each other in the thickness direction of the heatsink plate.

8. The semiconductor apparatus as claimed in claim 7, wherein a side surface of the inner perimeter wall situated below the downward facing step face is positioned closer to a center of the heatsink plate than a side surface of the inner perimeter wall situated above the upward facing step face in a plan view as viewed in the thickness direction of the heatsink plate.

9. A semiconductor apparatus, comprising:
   a heatsink plate;
   a substrate disposed on the heatsink plate;
   a circuit pattern disposed on the substrate;
   a semiconductor chip disposed on the circuit pattern;
   a case fixed to the heatsink plate and surrounding an outer perimeter of the substrate;
   a terminal attached to the case; and
   a wire configured to electrically connect the terminal to the circuit pattern or to the semiconductor chip,
   wherein in a plan view as viewed in a thickness direction of the heatsink plate, a portion of the circuit pattern overlaps the terminal,
   wherein the case is disposed on the heatsink plate,
   wherein in a plan view as viewed in the thickness direction of the heatsink plate, a portion of the case is in contact with the terminal and extends up to a surface point on the terminal, the surface point being connected to the wire,
   wherein the substrate includes:
      a metal plate disposed on the heatsink plate and having a first principal surface; and
      an insulating plate disposed in contact with the first principal surface and having a second principal surface facing away from the metal plate, the second principal surface being in contact with the circuit pattern; and
   wherein an inner perimeter wall of the case surrounding the outer perimeter of the substrate has an upward facing step face that is situated below a topmost surface of the case and that is parallel to the first principal surface of the heatsink plate, with the terminal being supported on the step face.

10. A semiconductor apparatus, comprising:
   a heatsink plate;
   a substrate disposed on the heatsink plate;
   a circuit pattern disposed on the substrate;
   a semiconductor chip disposed on the circuit pattern;
   a case fixed to the heatsink plate and surrounding an outer perimeter of the substrate;
   a terminal attached to the case; and
   a wire configured to electrically connect the terminal to the circuit pattern or to the semiconductor chip,
   wherein in a plan view as viewed in a thickness direction of the heatsink plate, a portion of the circuit pattern overlaps the terminal,
   wherein the case is disposed on the heatsink plate,
   wherein in a plan view as viewed in the thickness direction of the heatsink plate, a portion of the case is in contact with the terminal and extends up to a surface point on the terminal, the surface point being connected to the wire,
   wherein the substrate includes:
      a metal plate disposed on the heatsink plate and having a first principal surface; and
      an insulating plate disposed in contact with the first principal surface and having a second principal surface facing away from the metal plate, the second principal surface being in contact with the circuit pattern;
   wherein an inner perimeter wall of the case surrounding the outer perimeter of the substrate has an upward facing step face that is situated below a topmost surface of the case and that is parallel to the first principal surface of the heatsink plate, with the terminal being supported on the step face;
   wherein the inner perimeter wall of the case surrounding the outer perimeter of the substrate has, below the step face and in parallel to the step face, a downward facing step face, and wherein a portion of the circuit pattern and a portion of the downward facing step face oppose each other in the thickness direction of the heatsink plate; and
   wherein a side surface of the inner perimeter wall situated below the downward facing step face is positioned closer to a center of the heatsink plate than a side surface of the inner perimeter wall situated above the upward facing step face in a plan view as viewed in the thickness direction of the heatsink plate.

* * * * *